United States Patent [19]
Kawanobe et al.

[11] 3,922,400
[45] Nov. 25, 1975

[54] CHEMICAL PLATING METHOD

[75] Inventors: Toru Kawanobe; Kanji Otsuka, both of Kodaira, Japan

[73] Assignee: Hitachi, Ltd., Japan

[22] Filed: Aug. 23, 1973

[21] Appl. No.: 390,843

[30] Foreign Application Priority Data

Aug. 25, 1972 Japan .................................. 47-84551

[52] U.S. Cl. ..................... 427/265; 106/1; 427/404; 427/405

[51] Int. Cl. ....... B44d 1/18; C09d 5/00; C23c 3/00

[58] Field of Search ........... 117/212, 213, 113, 227, 117/130 E; 106/1

[56] References Cited

UNITED STATES PATENTS 3,589,916 6/1971 McCormack ........................... 106/1
3,672,986 6/1972 Schneble ............................. 117/212
3,700,469 10/1972 Okinaka .......................... 117/130 E
3,745,045 7/1973 Brenneman et al................. 117/212

*Primary Examiner*—John D. Welsh
*Attorney, Agent, or Firm*—Craig & Antonelli

[57] ABSTRACT

A chemical plating method which is mainly intended to effect bonding of semiconductor pellets and connector wires connected thereto, usually gold wires, to an insulating base board to produce a distributing board for a semiconductor integrated circuit. This method comprises forming metallized layers at least at two spots on the insulating base board, one of said metallized layers containing a catalyst which promotes plating of a first metal, such as nickel, then plating said metallized layer selectively with said first metal, and then plating the other metallized layer selectively with a second metal, such as gold, by using a plating solution having a faster plating rate for said other metallized layer than for the first metal.

17 Claims, 7 Drawing Figures

CHEMICAL PLATING METHOD

DETAILED DESCRIPTION OF THE INVENTION

This invention relates to a chemical plating method which is mainly intended for use in producing distributing boards for semiconductor integrated circuits.

Generally, in connecting the connector wires (usually gold wires), which have been connected to semiconductor pellets or their electrodes, further to a distributing film of a distributing board for semiconductor integrated circuit (IC), it is hardly possible to connect them directly to a metallized layer of tungsten, molybdenum or the like which serves as the base of the distributing film.

In order to solve this problem, it has been the practice to first form a gold-plated layer on the metallized layer, then bond semi-conductor pellets on said gold-plated layer, and then further bond gold wires under heat and pressure between the electrode of the semiconductor pellets and the gold layer. According to this method, however, there can not be obtained satisfactory adhesion of the semiconductor pellets. This is mainly attributable to the fact that when a silicon-made semiconductor is connected to the gold plated film through the medium of a gold-silicon eutectic alloy, part of the fold film is absorbed in the gold-silicon alloy, producing an almost same result as would be brought about when bonding the pellets directly to a metallized layer which has bad wettability to the gold-silicon alloy.

In order to surmount this difficulty, a method has been proposed in which nickel plating is first applied on the metallized layer, followed by gold plating thereon, and then the semiconductor pellet bonding and wire bonding are performed. This method, however, is still unsatisfactory because mutual sintering of nickel and gold could be caused by heating applied at the time of pellet bonding, resulting in reduced wire bondability.

Thus, either of the above-said methods has involved the problem of poor bondability of adhesion, in addition to the problem of increased consumption of gold, resulting in high manufacturing cost of semiconductor integrated circuits.

The present invention has been devised with a view to overcoming these problems, and one object of the invention is to better bondability of both semiconductor pellets and wires, and another object is to realize reduction of the amount of gold material used in plating.

In order to accomplish these objects, the present invention proposes a method characterized by the basic steps of forming metallized layers at least at two spots on an insulating base board, one of said metallized layers containing a catalyst capable of promoting the plating of a first metal, plating the one metallized layer selectively with the first metal, and then plating the other metallized layer selectively with a second metal by using a plating solution having the nature or characteristic to allow faster plating of the other metallized layer than plating of the first metal.

It is also envisaged in the present invention to provide a plating method used in producing base boards for semiconductor integrated circuits, characterized by forming metallized layers on an insulating base board, plating the semiconductor pellet, connecting the metallized layer selectively with nickel by providing in said layer a catalyst promoting nickel plating, and then plating at least a connector wire connecting the metallized layer selectively with gold by using a gold plating solution with a pH of higher than about 9.

Now, the present invention is described in detail by way of an embodiment thereof wherein the invention is directed to the production of a ceramic package for semiconductor integrated circuit.

DESCRIPTION OF THE DRAWINGS

FIG. 1 of the drawings shows the steps to be followed in the method of the present invention, which include the following:

Figure 1A:
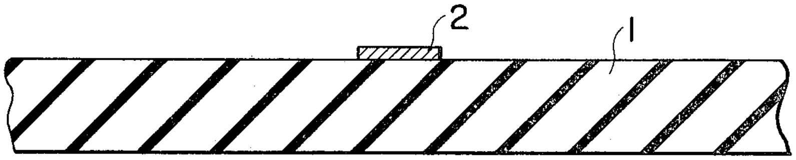
FIGS. 1(*a*) to 1(*e*) are sectional views showing the step by step process according to one embodiment of the present invention.
Figure 1B:
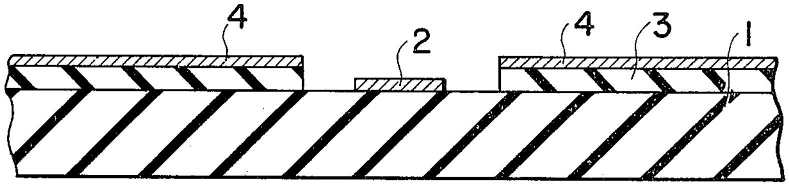
Figure 1C:
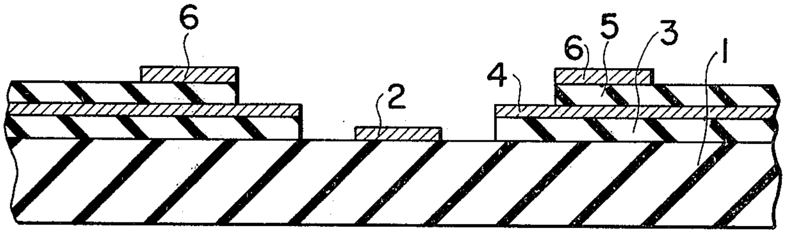
Figure 1D:
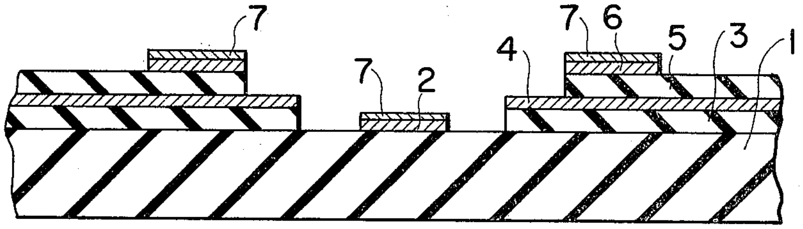
Figure 1E:
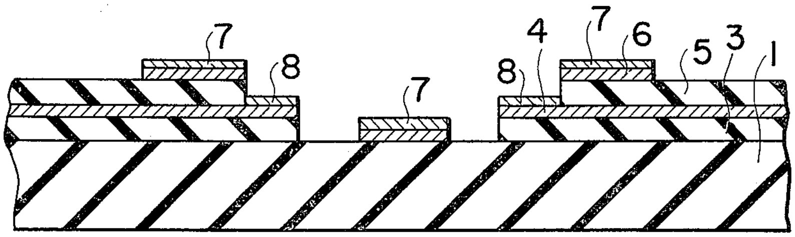

a. Powder of inorganic components of ceramic material, for example, mainly composed of alumina ($Al_2O_3$), i.e., about 85 to 90 weight percent with addition of silica ($SiO_2$), i.e., about 2 to 10 weight percent, and magnesia ($MgO$), i.e., about 2 to 10 weight percent, or pulverized steatite, forsterite, beryllia, spinel or the like, is mixed along with 3 to 10 weight percent of a binder (organic resin) and 15 to 30 weight percent of a solvent, and the mixture, after well mixed and kneaded, is subjected to pressure shaping to shape said mixture into a sheet-like mass, or a so-called "ceramic raw sheet" 1, having a thickness of about 0.5 to 1.2 mm, and then a pasty silicon pellet connecting conductor film 2 of a thickness of about 10 to 20 $\mu$, mainly consisting of molybdenum containing 0.5 to 5% of palladium, is applied on the sheet 1 by using a technique generally employed in printing, (i.e., screen printing) followed by drying of the paste. The particle sizes of diameters of the components mixed are selected to be, for example, in the range of about 0.1$\mu$ to 10$\mu$, preferably, about 0.5$\mu$ to 5$\mu$.

b. Pasty insulating layers 3 composed of the powder of inorganic components of ceramic material, binder and solvent are partly formed on the sheet 1 by again using a same printing technique to a thickness of about 10 to 30$\mu$, and the layers are dried in air at a temperature of about 80° to 120°C., preferably, 100°C. Then a pasty distributing film 4 containing from 70 to 80 weight percent of powder of a high melting point metal such as tungsten (W), molybdenum (Mo), or molybdenum manganese (80% Mo and 20% Mn), etc., used singly or in admixture, is formed on each of said insulating layers 3 to a thickness of about 10 to 20$\mu$ by using also a printing technique.

c. In the same way, insulating layer 5 are again formed on the surface of said sheet 1 to a thickness of about 10 to 30$\mu$ and then a sealing metal portion connecting conductor film 6 is formed on each said insulating layer 5 to a thickness of about 10 to 20$\mu$ by using the same conductor paste as used for pasting of said conductor film 2 in (*a*). Thereafter, sheet 1, along with the printed matters thereon, is heated to 1,600°C. in a reducing atmosphere to sinter said conductor, insulating layers and sheet 1 integrally with one another, thereby obtaining a ceramic distributing board.

d. This distributing board is immersed in potassium ferrocyanide to activate the conductor films and then further immersed in a chemical nickel plating solution containing about 1 weight percent Ni. This plating solution may be a mix solution of nickel chloride ($NiCl_2 \cdot 6H_2O$), sodium citrate($Na_3C_6H_5O_7 \cdot 2H_2O$), ammonium chloride ($NH_4Cl$), sodium hypophosphite ($NaH_2PO_2 \cdot H_2O$), and ammonia ($NH_3$).

Although chemical nickel plating cannot be practiced directly on such metal as tungsten, molybdenum, and molybdenum-manganese, it is possible to perform nickel plating on the semiconductor element connecting conductor film 2 and the sealing metal portion connecting conductor film 6 which are mainly composed of molybdenum but contain a small percentage of palladium which serves as catalyst to the oxidation of hypophospite.

Therefore, by immersing the distributing board in said nickel plating solution, it is possible to selectively form a nickel film 7 on the semiconductor pellet connecting conductor film 2 and the sealing metal portion connecting conductor film 6 to a thickness of about 3 to 10$\mu$, preferably, 5$\mu$.

e. After washing the distributing board with water, it is then immersed in 10% caustic soda (60°C.) for 10 minutes, and then chemical plating is practiced at 90°C. for 20 minutes by using the following gold plating solution added with ammonium hydroxide to raise the solution pH to above 9.5:

| | | |
|---|---|---|
| Potassium gold cyanide | $KAu(CN)_2$ | 5 gr/l |
| Nickel chloride | $NiCl_2 \cdot 6\ H_2O$ | 5 gr/l |
| Sodium citrate | $Na_3C_6H_5O_7 \cdot 2H_2O$ | 100 gr/l |

As a result, gold coatings 8, about 1 to 3$\mu$, preferably 1.5$\mu$ in thickness, are formed on the tungsten metallized layers, that is to say, on the distributing films 4. But, substantially no gold plating film is formed on the nickel film 7 on the semiconductor pellet connecting conductor film 2 and the seal ring connecting conductor films 6.

Figure 3:
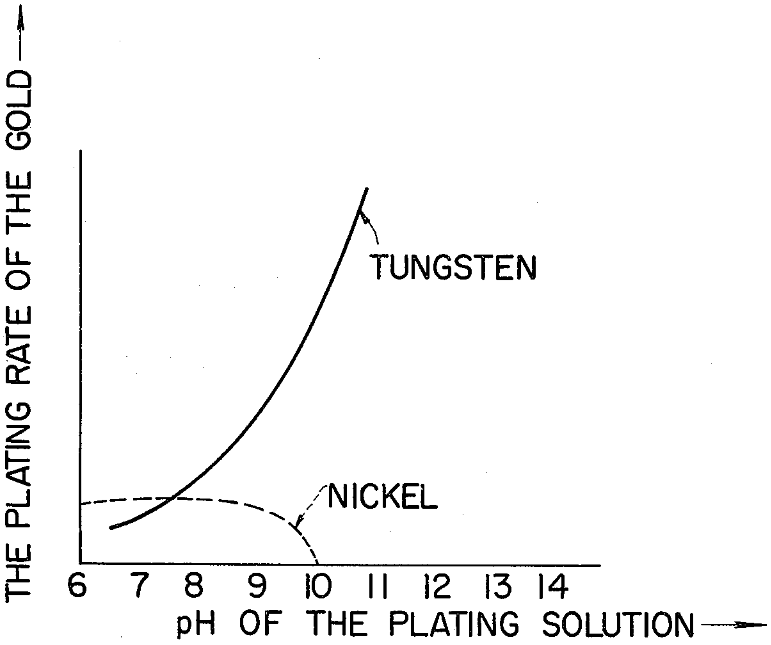
FIG. 3 is a plot of curves showing the relationship between pH of the chemical plating solution and plating rate.

It is to be noted that the plating rate of the gold plating solution for the metallized layer of, for instance, tungsten and that for nickel vary depending on pH of the plating solution as shown in FIG. 3.

In this figure, the solid line demonstrates the relationship between plating speed and pH as observed when practicing gold plating one tungsten and the dotted line represents such relationship as witnessed when practicing gold plating on nickel. As apparent from the figure, while plating rate for tungsten is raised proportionally due to an increase of pH, plating rate for nickel remains substantially constant at around 1$\mu$/lh until pH reaches 9, but when pH exceeds that point, plating rate is sharply reduced, and it finally becomes impossible to carry on plating any further when pH exceeds 10.

It is, therefore, possible to effect gold plating only on the distributing films 4 by suitably adjusting pH of the plating solution. Thereafter, the distributing board is heated at 850°C. for 5 minutes in a reducing atmosphere.

Figure 2:
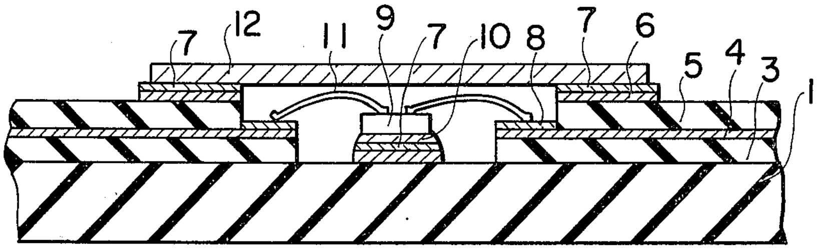
FIG. 2 is a sectional view showing a package with the pellets sealed.

FIG. 2 shows a finished semiconductor device using a package produced in the manner described above, said package being incorporated with semiconductor pellets 9, wire-bonded with gold wires 11 and sealed with a sealing metal 12. The gold-silicon eutectic alloy 10 is formed between the nickel film 7 and the semiconductor pellet 9.

As explained above, although it is impossible to perform chemical nickel plating on the metallized layers of tungsten, etc., such nickel plating can be practiced on the metallized layers containing palladium which acts as a catalyst, so that it is possible to effectuate selective nickel plating on the metallized layers by forming both a metallized layer composed of molybdenum-palladium and a metallized layer composed of tungsten. This enables strong pellet bonding to the metallized layers through the medium of nickel to realize marked improvement of mutual adhesion of pellets and conductor film.

Also, the gold plating rate for tungsten can be increased far greater than that for nickel by raising pH of the gold plating solution to a certain level (higher than 9). Thus, as gold plating can be applied on the tungsten metallized layer to be wire-bonded, adhesion of wires connected on this tungsten metallized layer is greatly improved. While on the other hand, since substantially no gold plating layer is formed on the nickel layer, the amount of gold used can be sizably reduced. Although palladium was cited as catalyst material in the above-described embodiment, it is possible to use other palladium type metals such as, for example, platinum, nickel and cobalt.

Also, in the present invention, nickel used as metal to be formed on the pellet connecting metallized layer may be sutstituted by other types of well-electricoconductive metals such as cobalt, copper, silver or the like.

Although the present invention has been described by way of an embodiment where a distributing base board is formed by using a multi-layer printing system, this invention is by no means limited to such particular embodiment. The principles of the present invention can as well be applied for forming a distributing board by employing a lamination system.

Also, the method of the present invention can be utilized not only for production of ceramic packages for semiconductor integrated circuits, as described hereabove, but also for a variety of other purposes such as for production of base boards for luminous indicator devices using luminuous diodes.

While the novel principles of the invention have been described, it will be understood that various omissions, modifications and changes in these principles may be made by one skilled in the art without departing from the spirit and scope of the invention.

What is claimed is:

1. A method for selectively plating gold comprising preparing an insulated body, forming on the surface of said body a first conductive layer consisting essentially of tungsten, molybdenum, molybdenum-manganese or mixtures thereof and a second conductive layer spaced from said first conductive layer and having a surface of nickel, cobalt, copper or silver, and contacting said first and second conductive layers with a gold plating solution having pH higher than 9 so as to selectively plate gold on said second conductive layer.

2. The method of claim 1, wherein said insulated body is a ceramic.

3. The method of claim 2, wherein said ceramic material is composed mainly of alumina, silica and magnesia.

4. The method of claim 2, wherein said ceramic is composed of steatite, forsterite, beryllia or spinel.

5. The method of claim 2, wherein said second conductive layer is composed of a layer of molybdenum containing about 0.5 to 5% palladium having a coating thereof consisting essentially of nickel, cobalt, copper or silver.

6. The method of claim 5, wherein said second conductive layer has a surface of nickel.

7. The method of claim 2, wherein said second conductive layer has a surface of nickel.

8. The method of claim 2, wherein said first conductive layer and said second conductive layer are applied by electroless coating.

9. The method of claim 8, wherein gold is selectively plated on said second conductive layer by electroless coating.

10. The method of claim 9, wherein gold is selectively plated on said second conductive layer by means of a gold plating solution comprising potassium gold cyanide, nickel chloride and sodium citrate.

11. The method of claim 10, wherein said gold plating solution contains about 5 parts by weight potassium gold cyanide and about 5 parts by weight nickel chloride for each 100 parts by weight of sodium citrate.

12. The method of claim 2, wherein gold is selectively plated on said second conductive layer by means of a gold plating solution comprising potassium gold cyanide, nickel chloride and sodium citrate.

13. The method of claim 12, wherein said gold plating solution contains about 5 parts by weight potassium gold cyanide and about 5 parts by weight nickel chloride for each 100 parts by weight of sodium citrate.

14. The method of claim 1, wherein gold is selectively plated on said second conductive layer by means of a gold plating solution comprising potassium gold cyanide, nickel chloride and sodium citrate.

15. The method of claim 14, wherein said gold plating solution contains about 5 parts by weight potassium gold cyanide and about 5 parts by weight chloride for each 100 parts by weight of sodium citrate.

16. A chemical plating method used in producing base boards for semiconductor integrating circuits, comprising the steps of forming first and second metallized layers on an insulating base board, plating the first layer selectively with nickel by containing in said first layer a catalyst which promotes plating of nickel, and then plating the second metallized layer selectively with gold by using a gold plating solution with pH of higher that 9.

17. The method of claim 16, wherein said first metallized layer is an electrolessly coated layer of tungsten, molybdenum, molybdenum-manganese or mixtures thereof, wherein said second metallized layer is spaced from said first metallized layer and comprises a layer of molydbenum containing 0.5 to 5 % by weight palladium, and wherein said second metallized layer is electrolessly plated with gold by means of a gold plating solution consisting essentially of potassium gold cyanide, nickel chloride and sodium citrate.

* * * * *